United States Patent

Worley, III

[11] Patent Number: 6,108,385
[45] Date of Patent: Aug. 22, 2000

[54] METHOD AND APPARATUS FOR REDUCING INTERMODULATION DISTORTION IN DIGITAL WIDEBAND TRANSMISSION SYSTEMS

[75] Inventor: William Spencer Worley, III, Half Moon Bay, Calif.

[73] Assignee: Silicon Wireless Limited, Mountain View, Calif.

[21] Appl. No.: 08/679,424

[22] Filed: Jul. 8, 1996

[51] Int. Cl.[7] ............................................. H04K 1/02
[52] U.S. Cl. ........................ 375/296; 375/296; 375/297; 330/149
[58] Field of Search ................. 330/124 R, 149, 330/52, 151, 127; 375/296, 297, 295; 455/126, 127

[56] References Cited

U.S. PATENT DOCUMENTS

| | | | |
|---|---|---|---|
| 4,462,001 | 7/1984 | Girard | 330/149 |
| 4,700,151 | 10/1987 | Nagata | 332/123 |
| 4,943,783 | 7/1990 | Nojima | 330/149 |
| 5,049,832 | 9/1991 | Cavers | 330/149 |
| 5,132,639 | 7/1992 | Blauvelt et al. | 330/149 |
| 5,321,849 | 6/1994 | Lemson | 455/67.1 |
| 5,455,538 | 10/1995 | Kobayashi et al. | 330/149 |
| 5,524,286 | 6/1996 | Chiesa et al. | 455/126 |
| 5,610,554 | 3/1997 | Anvari | 330/52 |
| 5,675,285 | 10/1997 | Winters | 330/124 R |

FOREIGN PATENT DOCUMENTS 0085600  1/1983  European Pat. Off. .

OTHER PUBLICATIONS

"Simulation and Analysis of an Adaptive Predistorter Utilizing a Complex Spectral Convolution," Stapleton et al., *IEEE Transactions on Vehicular Technology*, New York, vol. 41, No. 4, pp. 387–394, Nov. 1992.

"Intermodulation Distortion in a Multi–Signal Environment," by Michael Leffel, *RF Design*, Motorola, Inc., pp. 78–84, Jun. 1995.

*Primary Examiner*—Stephen Chin
*Assistant Examiner*—Shuwang Liu
*Attorney, Agent, or Firm*—David E. Lovejoy

[57] ABSTRACT

Signal processing to remove unwanted signal components of non-linear elements such as RF amplifiers in broadband wireless communications systems that exhibit unwanted intermodulation products. An information signal is processed to form a processed output signal, $V_{od}$. A signal preprocessor includes a base modulator for modulating the information signal to form base modulated signals, a band modulator for modulating the base modulated signals to form an input signal, $V_i$, a distortion processor for providing a predistortion signal $V_{pd}$ having selected predistortion terms of the Taylor series form $[k_1(V_i)^1, k_2(V_i)^2, k_3(V_i)^3, \ldots]$, and a broadband processor for combining the input signal $V_i$ and the predistortion signal $V_{pd}$ to form a predistorted signal $V_{id}$ with the selected predistortion terms of the Taylor series form $[k_1(V_i)^1, k_2(V_i)^2, k_3(V_i)^3, \ldots]$ having reduced amplitude. A non-linear element having a non-linear transfer function for processes the predistorted signal $V_{id}$ to form the output signal with the selected predistortion terms of the Taylor series form $[k_1(V_i)^1, k_2(V_i)^2, k_3(V_i)^3, \ldots]$ having reduced amplitude. Amplifiers achieve substantial improvements in efficiency, an increase of 40–80% of usable power, due to the reduction of intermodulation products. In particular, the third order products are reduced.

11 Claims, 4 Drawing Sheets

FIG. 1
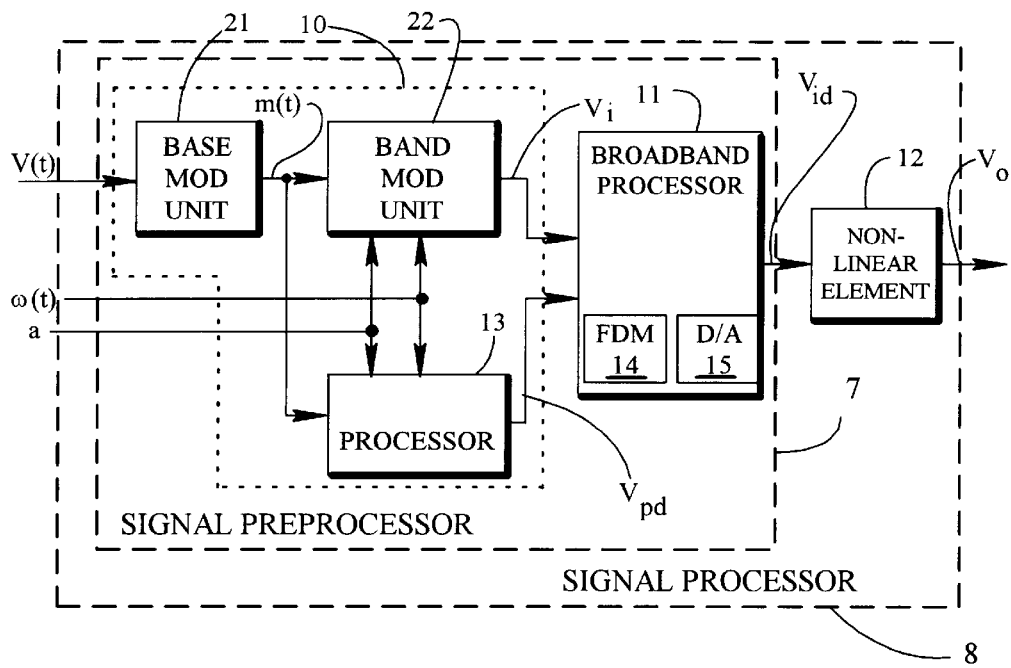
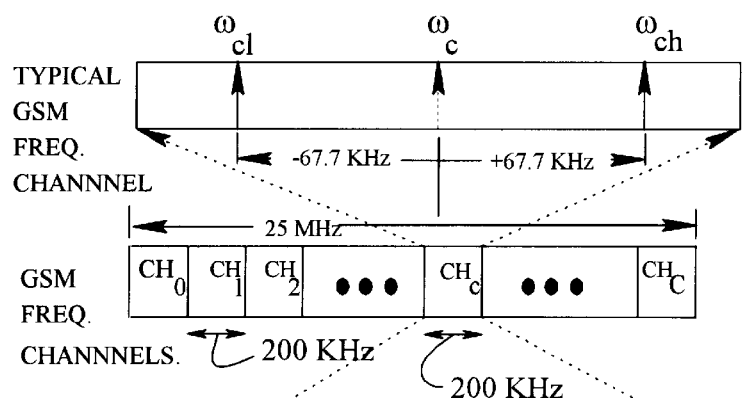
FIG. 2b TYPICAL GSM FREQ. CHANNNEL
FIG. 2a GSM FREQ. CHANNNELS.
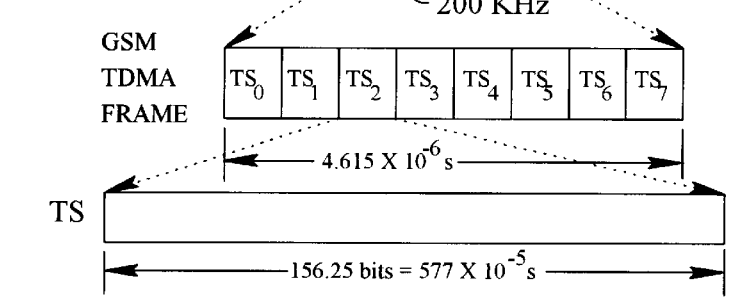
FIG. 2c GSM TDMA FRAME
FIG. 2d TS

METHOD AND APPARATUS FOR REDUCING INTERMODULATION DISTORTION IN DIGITAL WIDEBAND TRANSMISSION SYSTEMS

NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

The present invention relates to the field of signal processors and more specifically to methods and apparatus for minimizing the distortion caused by non-linear elements, such as amplifiers, in wireless communications systems.

Distortion

Non-linear elements such as amplifiers in communications systems inherently provide distorted output signals that are not simply linear functions of the input signals. Distortion can be reduced by separating wanted in-band signal components from unwanted out-of-band signal components. Such separation is particularly effective for narrow band signals where filters can be used to remove unwanted signal components. For a communications system that operates only on a single (in-band) channel, the out-of-band signal components generated by an amplifier can be easily removed by filtering or can be ignored if they are non-interfering. However, in communications systems that use signals that extend over a broad band of frequencies (broadband signals), the separation of in-band and out-of-band signals is more difficult. In communications systems that operate with a number of adjacent channels in adjacent frequency bands, the out-of-band components for one channel frequently exist in the same frequency spectrum as (and interfere with) the in-band signals of adjacent channels.

Cellular Systems

Present day cellular mobile telephone systems operate with many adjacent frequency channels and operate in an environment where elimination of signal distortion is important. Cellular mobile telephone systems "reuse" frequency within groups of cells to provide wireless two-way radio frequency (RF) communication to large numbers of users. Each cell covers one geographic area and collectively groups of adjacent cells can cover a larger geographic region. Each cell is allocated a fraction of the total amount of RF spectrum for cellular users located in the cell.

In cellular systems, typically each cell has a base station with radio frequency (RF) transmitters and RF receivers co-sited for transmitting and receiving communications with cellular users. The base station employs forward RF frequency bands (carriers) to transmit forward channel communications to users and employs reverse RF carriers to receive reverse channel communications from users in the cell. Conventional forward channel communications employ fixed power, at fixed frequencies and have fixed sectors if sectorized antennas are used.

The forward and reverse channel communications use separate frequency bands to enable simultaneous transmissions in both directions using frequency domain duplex (FDD) signaling. Time domain duplex (TDD) signaling, in which the forward and reverse channels take turns using the same frequency band, is possible.

In cellular systems, particular channels are allocated to individual users. Each user=3 s communications are routed by the system through the channel allocated to that user. Signals broadcast by the system must be carefully regulated so that they remain within the allocated channels. "Out-of-band" signals produced by intermodulation signal components from one channel can cause unacceptable interference with communications in other channels. Intermodulation products are produced through the interaction of two or more wanted signals in non-linear system elements. For example, in a multiband 40-channel communications system, thousands of intermodulation products may exist. Cellular communications systems, therefore, place stringent restrictions on out-of-band signal emissions in order to minimize channel-to-channel interference.

Distortion Reduction

In order to reduce the out-of-band signal emissions from one channel into another, many different methods have been proposed. As one example, feedback systems have been proposed in which a portion of the amplifier output signal is processed and fed back to alter the input signal to the amplifier. Feedback systems, however, are expensive and have not achieved entirely satisfactory results. As another example, predistorting systems have been proposed to predistort the input signal to an amplifier with a predistortion transformation which is complementary to the distorting transformation of the amplifier. The predistorted input signal is intended to produce an undistorted output signal that is a linear function of the input signal. su Known predistortion techniques, however, have primarily operated on the wanted signal components and have not satisfactorily processed unwanted intermodulation signal components.

One prior art predistortion method is described in U.S. Pat. No. 4,462,001 entitled BASEBAND LINEARIZER FOR WIDEBAND, HIGH POWER, NONLINEAR AMPLIFIERS. In that patent, separate look-up tables containing amplitude and phase correction factors are provided containing a multiplicity of entries which define predistortion transformation parameters appropriate for use with a corresponding multiplicity of different input signals. In operation, the fluctuating power level of the input signal to be amplified is continuously measured and used to address the look-up tables to obtain corresponding predistortion parameters to predistort the input signal before it is input to the amplifier.

Another prior art method is described in U.S. Pat. No. 4,700,151 entitled MODULATION SYSTEM CAPABLE OF IMPROVING A TRANSMISSION SYSTEM. In that patent, the real and imaginary quadrature components of the input signal sample are used to index a look-up table containing more than a million entries of predistortion transformation parameters. The look-up table entries are adaptively changed in response to variations in the amplifier's distorting characteristics. If the channel is changed, as is common in cellular systems, every entry in the look-up table must be updated. This updating process is burdensome and often takes a longer time than is available. This technique is used to modify the wanted signal rather than the intermodulation components.

Still another prior art method is described in U.S. Pat. No. 5,049,832 entitled AMPLIFIER LINEARIZATION BY ADAPTIVE PREDISTORTION. In that patent, stored table entries in rectangular coordinate format are provided to enable the subsequent predistortion operation to be performed more simply than in the U.S. Pat. No. 4,700,151 patent with a smaller look-up table. Again, this technique is used to modify the wanted signal, not the intermodulation components.

The known methods, like those discussed above, primarily address the wanted signals, not the intermodulation components, so that the results obtained are not entirely satisfactory and particularly are not satisfactory for broadband systems having many adjacent frequency channels.

In broadband systems, even though the adverse effects of intermodulation distortion are known, amplifiers have not been able to adequately overcome the intermodulation distortion problems. To date, even the best amplifiers achieve only 20 to 40% efficiency for broadband applications. This low efficiency is in large part due to the third order intermodulation products.

The intermodulation products are described, for example, in the article entitled "Intermodulation Distortion in a Multi-Signal Environment," by Michael Leffel, *RF Design*, pages 78–84, Jun. 1995, which describes the intermodulation caused by multiple input tones. The article predicts the behavior of amplifiers having multiple input tones based upon two-tone intermodulation parameters.

Although predistortion has been proposed to improve the operation of amplifiers, in actual practice, there is much need for improved predistortion methods and apparatus for broadband applications such as cellular systems. Although intermodulation distortion products have been identified as the cause of problems, the known signal processors have not been satisfactory for reducing those problems in broadband systems.

In accordance with the above background, there is a need for improved signal processors for use in broadband communications systems.

SUMMARY OF THE INVENTION

The present invention is an apparatus and method for signal processing to remove unwanted signal components and particularly for signal processing with non-linear elements such as RF amplifiers in broadband wireless communications systems that exhibit unwanted intermodulation products.

The signal processor operates to process an information signal to form a processed output signal, $V_{od}$. The signal processor includes a signal preprocessor that in turn includes a base modulator for modulating the information signal to form base modulated signals, a band modulator for modulating the base modulated signals to form an input signal, $V_i$, a distortion processor for providing a predistortion signal $V_{pd}$ having selected predistortion terms of the Taylor series form $[k_1(V_i)^1, k_2(V_i)^2, k_3(V_1)^3, \ldots ]$, and a broadband processor for combining the input signal $V_i$ and the predistortion signal $V_{pd}$ to form a predistorted signal $V_{id}$ with the selected predistortion terms of the Taylor series form $[k^1(V_i)^1, k_2(V_1)^2, k_3(V_i)^3, \ldots ]$ having reduced amplitude. The signal processor additionally includes a non-linear element having a non-linear transfer function for processing the processed predistorted signal $V_{id}$ to form the output signal with the selected predistortion terms of the Taylor series form $[k_1(V_i)^1, k_2(V_i)^2, k_3(V_i)^3, \ldots ]$ having reduced amplitude.

This invention reduces the unwanted emissions caused by intermodulation distortion that have been a major limitation in linear and wide band transmission systems. Amplifiers using the present invention achieve substantial improvements in efficiency, an increase of 40–80% of usable power, due to the reduction of intermodulation products. In particular, the third order products are reduced to improve the performance of transmission systems. This invention can be used to eliminate any selected intermodulation distortion desired. The present invention can operate with or without feedback and greatly simplifies the design and cost of wideband power amplifiers.

The foregoing and other objects, features and advantages of the invention will be apparent from the following detailed description in conjunction with the drawings.

BRIEF DESCRIPTION OF THE DRAWINGS

FIG. 1 depicts a signal processor suitable for use in wireless communications systems.

FIGS. 2*a*, 2*b*, 2*c* and 2*d* depict signals in a GSM system.

DETAILED DESCRIPTION

Signal Processor—FIG. 1

Figure 3:
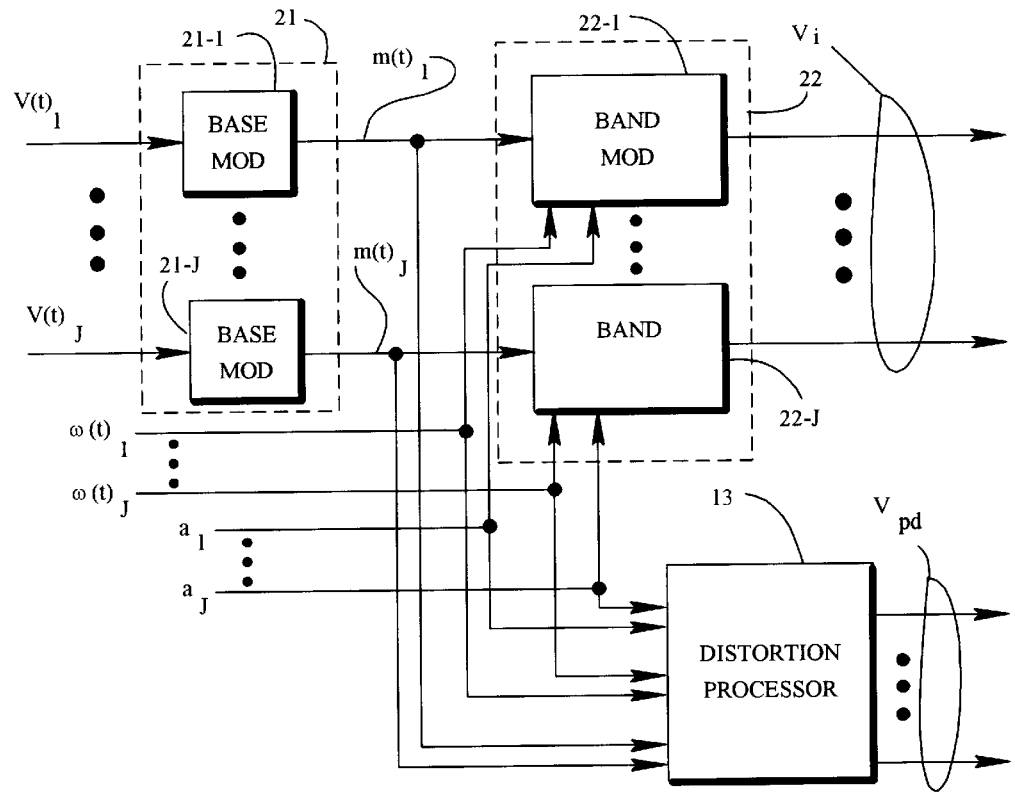
FIG. 3 depicts a block diagram of the modulator of the FIG. 1 circuitry.

In FIG. 1, a signal processor 8 is provided suitable for use in wireless communications systems. The signal processor 8 includes a signal preprocessor 7, formed of a modulator 10 and a broadband processor 11, and includes a non-linear element 12. Element 12 is typically a power amplifier. The modulator 10 receives one or more input information signals $V(t)$ including information signals $V_1(t), V_2(t), \ldots, V_j(t), \ldots, V_j(t)$, receives one or more carriers $\omega(t)$ including carriers $\omega_1(t), \omega_2(t), \ldots \omega_j(t), \omega_j(t)$, and receives one or more scalers "a" including scalers $a_1, a_2, \ldots, a_j$. The modulator 10 includes a base modulator unit 21 for baseband modulation of the $V(t)$ information signals to provide baseband modulated signals $m(t)$, a band modulation unit 22 for modulation of the $\omega(t)$ carrier bands by the baseband signals $m(t)$ to form modulated signals $V_i$ and a distortion processor 13 that generates a predistortion signal, $V_{pd}$.

The output from the base modulator unit 21 is one or more modulated signals $m(t)$ including modulated signals $m_1(t), m_2(t), \ldots, m_j(t), \ldots, m_j(t)$ that each occupy a portion of a broadband spectrum. The distortion processor 13 in modulator 10 receives one or more of the modulated signals $m(t)$, one or more of the carriers, $\omega(t)$, and one or more of the scalers, "a," to form the distortion signals, $V_{pd}$.

In FIG. 1, broadband processor 11 operates to combine the modulated signals $V_i$ and the distortion signals, $V_{pd}$, to form a broadband signal, $V_{id}$. The $V_{id}$ output from the broadband processor 11 is the input signal to the non-linear element 12. Non-linear element 12, typically an RF power amplifier, has a non-linear transfer function, $T_{pa}$ which operates on the input signal, $V_{id}$, to produce the broadband output signal, $V_o$. The distortion processor 13 of FIG. 1 operates to insert a pre-distortion signal, $V_{pd}$ into the broadband input signal, $V_{id}$, as an input to the non-linear element 12 so that the output signal, $V_o$, from the non-linear element 12 has unwanted signal components minimize intermodulation distortion products are eliminated.

In FIG. 1, the broadband processor 11 typically includes a frequency division multiplexer 14 and a digital-to-analog (D/A) converter 15 and may include other conventional elements such as frequency shifters. The frequency division multiplexer 14 operates to multiplex each of the corresponding components of the $V_i$ and $V_{pd}$ signals into corresponding channels. Typically, the broadband signal has channels corresponding to the carriers $\omega_1(t), \omega_2(t), \ldots, \omega_j(t)$. The frequency division multiplexer 14, in one embodiment, is an adder that concurrently adds each of the component signals of $V_i$ and $V_{pd}$. The multiplexed broadband signal from multiplexer 14 is D/A converted in converter 15 to provide the analog broadband signal $V_{id}$.

GSM Broadband Signals—FIG. 2

In FIG. 2a, the carrier frequencies $\omega_1(t), \omega_2(t), \ldots, \omega_J(t)$ of FIG. 1 are the center frequencies for the channels $CH_0, CH_1, \ldots, CH_c, \ldots, CH_C$. In a GSM embodiment, the channels are each 200 KHz in bandwidth as shown for typical channel $CH_C$ in FIG. 2b. In FIG. 2b, the channel $CH_c$, typical of each of the channels, has a low frequency $\omega_{cl}$ and a high frequency $\omega_{ch}$. Typically, $\omega_{cl}$ is 67.7 KHz below the center frequency $\omega_c$ and $\omega_{ch}$ is 67.7 KHz above the center frequency $\omega_c$. For a GSM system, the information signal is in digital form and has logical 1's and logical 0's. The logical 1's and logical 0's of the information signal frequency shift key (FSK) modulate the carrier frequency of FIG. 2b such that data values of logical 1 cause the carrier $\omega_{ch}$ to be on and the carrier $\omega_{cl}$ to be off. Similarly, for data values of logical 0, the modulation causes the carrier $\omega_{cl}$ to be on and the carrier $\omega_{ch}$ to be off. Such modulation causes the distribution of the baseband data signal of the modulated signal $m_j(t)$ for the channel with center frequency carrier $\omega_c$ to be within the 200 KHz. While FSK modulation is typical in GSM systems, other types of baseband modulation can be employed. For example, $\Delta$ modulation or FM modulation are other typical baseband modulations. In FIG. 2b, FM modulation is represented if $\omega_{cl}$ is the frequency for one cosine function and $\omega_{ch}$ is a frequency for another cosine function.

In GSM systems, each of the frequency channels of FIG. 2b is typically further divided into eight additional subchannels by time division multiplexing as shown in FIG. 2c. In FIG. 2c, the eight time slots $TS_0, TS_1, \ldots, TS_7$ are shown for a typical one of the channels $CH_c$ of FIG. 2b. Each of the time slots of FIG. 2c in a GSM system is defined to include 156.25 bits spread over a duration of $577 \times 10^{-6}$ seconds. These bits in each time slot are selected as a logical 1 or a logical 0 for transmitting information including data and control information.

Irrespective of the different forms of modulation which are employed in any system, the resultant baseband modulation from the base modulator unit 21 of FIG. 1 is typically spread over a particular bandwidth for a particular channel.

Modulator—FIG. 3

In FIG. 3, further details of the modulator 10 of FIG. 1 are shown. The base modulator unit 21 of FIG. 1 includes the base modulators 22-1, ..., 21-J which in turn receive the information signals $V_1(t), \ldots, V_J(t)$ and provide the baseband modulated output signals m(t), specifically the modulated baseband signals $m_1(t), \ldots, m_J(t)$.

In FIG. 3, the band modulator unit 22 of FIG. 1 includes the band modulators 22-1, ..., 22-J. The modulators 22-1, ..., 22-J receive the baseband modulated signals $m_1(t), \ldots, m_J(t)$, the carrier frequencies $\omega_1(t), \ldots, \omega_J(t)$, and the scalers $a_1, \ldots, a_J$, respectively, and produce the carrier frequency outputs, $V_i$, which include the carrier outputs $V_{i(1)}, \ldots, V_{(i)(J)}$, respectively.

In FIG. 3, the distortion processor 13 receives the baseband modulated signals $m_1(t), \ldots, m_J(t)$, receives the carrier frequencies $\omega_1(t), \ldots, \omega_J(t)$, and receives the scalers $a_1, \ldots, a_J$ and produces the predistortion output signal, $V_{pd}$, including the predistortion terms $V_{pd(1)}, \ldots, V_{pd(s)}, \ldots, V_{(pd)(S)}$, where S is some integer.

Figure 4:
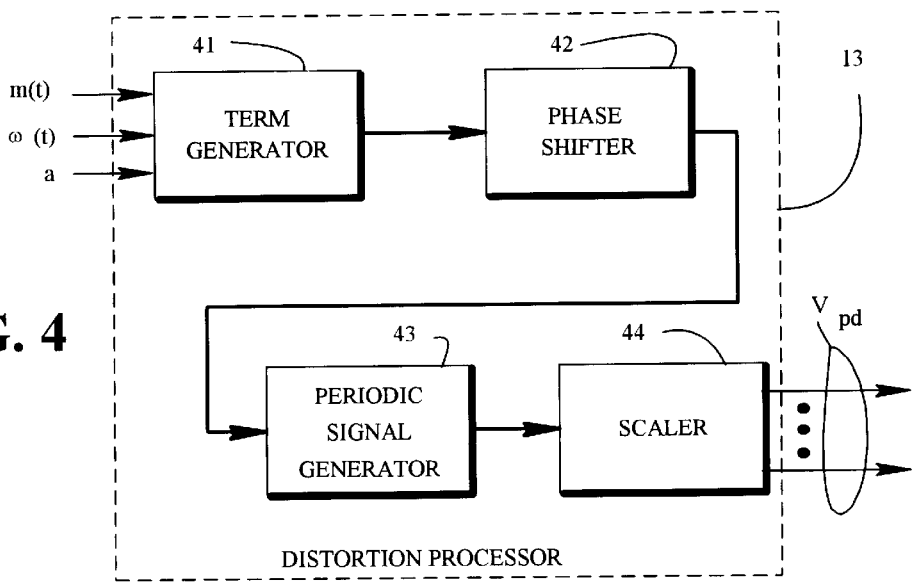
FIG. 4 depicts a block diagram of the distortion processor of the FIG. 1 circuitry.

Distortion Processor—FIG. 4

In FIG. 4, further details of the distortion processor 13 of FIG. 1 and FIG. 3 are shown. The distortion processor receives the baseband signals m(t) and the carrier frequencies $\omega(t)$ as inputs to a term generator 41. The term generator 41 generates various ones of the terms to form the predistortion signal. The terms from term generator 41 are input to a phase shifter 42 which properly aligns the phase of the terms so that they will be out of phase by 180° from the phase of corresponding terms in the $V_i$ signal input to the broadband processor of FIG. 11. The phase shifter 42 provides the phase shifted signals to the periodic signal generator 43 which, for example, is a cosine generator that generates the cosine of the outputs from the phase shifter 42. The periodic function signals are then scaled in scaler 44 and are provided as the components of the predistortion output signal $V_{pd}$. While the phase shifter 42 is shown in FIG. 4 as providing a phase shift angle to the signal input to the periodic signal generator 43, the same result can be achieved by changing the sign of the output after the cosine generator.

Figure 5:
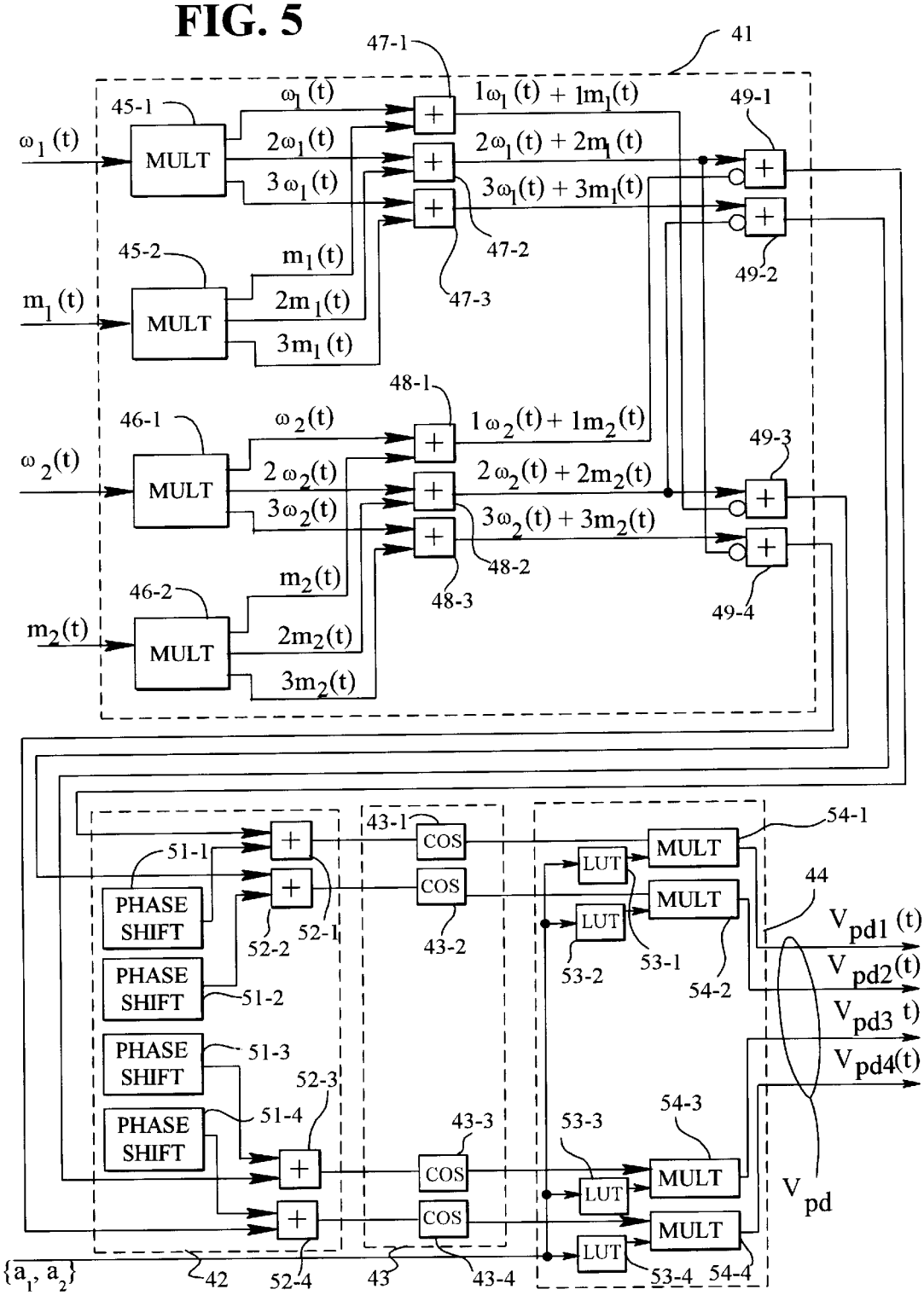
FIG. 5 depicts a block diagram of one particular distortion processor of FIG. 4 for a two carrier example.

Two Carrier Distortion Processor—FIG. 5

In FIG. 5, further details of the distortion processor of FIG. 4 are shown for a two-carrier embodiment. The term generator 41 receives the carrier terms $\omega(t)$ and specifically, for the two carrier example, receives the $\omega_1(t)$ and $\omega_2(t)$ carriers. Similarly, the term generator 41 receives the baseband modulated information signals m(t) and, for the two-carrier example, receives the information modulated baseband signals $m_1(t)$ and $m_2(t)$. The multipliers 45-1 and 45-2 generate the one times, two times, and three times signals from the $\omega_1(t)$ and $m_1(t)$ signals. The multipliers 46-1 and 46-2 generate the one times, two times, and three times signals from the $\omega_2(t)$ and $m_2(t)$ signals.

In FIG. 5, the adders 47-1, 47-2 and 47-3 add the one time signals $\omega_1(t)$ and $m_1(t)$ to form $\omega_1(t)+m_1(t)$, add the two times signals to form $2\omega_1(t)+2m_1(t)$, and add the three times signals to form $3\omega_1(t)+3m_1(t)$. Similarly, the adders 48-1, 48-2 and 48-3 add the one, three times signals to form $1\omega_2(t)+m_2(t)$, $2\omega_2(t)+m_2(t)$, $3\omega_2(t)+3m_2(t)$. The adders 49-1, 49-2 have complementary inputs and provide the difference signals $[2\omega_1(t)+2m_1(t)]-[1\omega_2(t)+1m_2(t)]$ and $[3\omega_1(t)+3m_1(t)]-[2\omega_2(t)+2m_2(t)]$. Similarly, the adders 49-2 and 49-4 have complementary inputs and provide the difference signals $[2\omega_2(t)+2m_2(t)]-[1\omega_1(t)+1m_1(t)]$ and $[3\omega_2(t)+3m_2(t)]-[2\omega_1(t)+2_1(t)]$, respectively. The difference signals from the adders 49-1, 49-2, 49-3 and 49-4 are input to the adders 52-1, 52-2, 52-3 and 52-4 respectively. The adders 52-1, 52-2, 52-3 and 52-4 receive inputs $\phi_1, \phi_2, \phi_3, \phi_3$ from the phase shifters 51-1 51-2, 51-3 and 51-4, respectively, to provide the phase shifted difference signals to the cosine units 43-1, 43-2, 43-3 and 43-4, respectively. The cosine signals from the cosine units 43-1, 43-2, 43-3 and 43-4 are as follows:

$$\{[2\omega_1(t)+2m_1(t)]-[1\omega_2(t)+1m_2(t)]+\phi_1\}$$

$$\{[2\omega_2(t)+2m_2(t)]-[1\omega_1(t)+1m_1(t)]+\phi_2\}$$

$$\{[3\omega_1(t)+3m_1(t)]-[2\omega_2(t)+2m_2(t)]+\phi_3\}$$

$$\{[3\omega_2(t)+3m_1(t)]-[2\omega_1(t)+2m_1(t)]+\phi_4\}.$$

The cosine signals from the cosine units 43-1, 43-2, 43-3 and 43-4 are input to the multipliers 54-1, 54-2, 54-3 and 54-4, respectively, which are multiplied by scaled values $S_{f(1)}, S_{f(2)}, S_{f(3)}$ and $S_{f(4)}$ determined by the $a_1$ and $a_2$ scalers input to the lookup tables 53-1, 53-2, 53-3 and 53-4, respectively. The output from the multipliers 54-1, 54-2, 54-3 and 54-4 are the $V_{pd}$ signals $V_{pd1}(t), V_{pd2}(t), V_{pd3}(t)$ and $V_{pd4}(t)$, respectively, having the scaled harmonic terms that are to be inserted into the non-linear element 12 of FIG. 1 as follows:

$$V_{pd1}(t)=S_{f(1)}\cos\{[2\omega_1(t)+2m_1(t)]-[1\omega_2(t)+1m_2(t)]+\phi_1\}$$

$$V_{pd2}(t)=S_{f(2)}\cos\{[2\omega_2(t)+2m_2(t)]-[1\omega_1(t)+1m_1(t)]+\phi_1\}$$

$$V_{pd3}(t)=S_{f(3)}\cos\{[3\omega_1(t)+3m_1(t)]-[2\omega_2(t)+2m_2(t)]+\phi_1\}$$

$$V_{pd4}(t)=S_{f(4)}\cos\{[3\omega_2(t)+3m_2(t)]-[2\omega_1(t)+2m_1(t)]+\phi_1\}$$

Operation

Referring to FIG. 1, modulator 10 receives the input information signals, $V_j(t)$, the carriers, $\omega_j(t)$, and the scalers, $a_j$, to produce the modulated input signal, $V_i$, and a predistortion signal, $V_{pd}$. The broadband processor 11 receives the modulated input signal, $V_i$, and the predistortion signal, $V_{pd}$, and forms the broadband output, $V_{id}$, as follows:

$$V_{id}=V_iV_{pd} \quad\quad \text{Eq. (1)}$$

The non-linear element 12 receives the broadband signal, $V_{id}$, and has a transfer function, $T_{pa}$, so that the output signal, $V_o$, is formed as follows:

$$V_o=V_{id}(T_{pa}) \quad\quad \text{Eq. (2)}$$

Using Eq. (1) in Eq. (2), the output signal, $V_o$, is given as follows:

$$V_o=(V_i+V_{pd})(T_{pa}) \quad\quad \text{Eq (3)}$$

In Eq. (3), the output signal, $V_o$, is a function of both the normal input signal, $V_i$, that is present in the absence of any predistortion processing and the predisdortion signal, $V_{pd}$. If the distortion processor 13 is inactivated and does not perform distortion processing, then $V_{pd}$ in Eq. (3) is equal to zero and therefore Eq. (3) reduces to the normal relationship that exists for any non-linear element without predistortion processing where the distorted output, $V_{od}$, is given as follows:

$$V_{od}=V_i(T_{pa}) \quad\quad \text{Eq. (4)}$$

In a typical example, the non-linear element 12 of FIG. 1 is a power amplifier used for wireless transmission and the non-linearities of the power amplifier cause unwanted signal components to be generated in the transmitted signal. Government regulations and operational requirements dictate that such unwanted signal components not be transmitted at power levels that will cause interference. One way to achieve non-interference of unwanted signal components is to reduce the power output of the power amplifier, but such reduction also reduces the output power of the wanted signal components and reduces, therefore, the efficiency of the amplifier. For broadband signals that have multiple input frequencies, this efficiency problem is particularly severe.

Any distorted output signal such as $V_{od}$ of Eq. (4) can be expressed in terms of the input signal, $V_i$, using a Taylor series expansion as follows:

$$V_{od}=k_1(V_i)^1+k_2(V_i)^2+k_3(V_i)^3+k_4(V_i)^4+k_5(V_i)^5 \quad\quad \text{Eq. (5)}$$

Also, it is known that the distorted output signal, $V_{od}$, of a non-linear power amplifier can be represented as a function of the input voltage, $V_i$, as follows:

$$V_{od}=G(e^{(V_i/V_{tr})}-1) \quad\quad \text{Eq. (6)}$$

where, $V_{tr}$=threshold voltage (value useful in connection with relationship between $V_i$ and G).

G=$(R_{load})(I_{quiescent})$, the product of the load resistance and the quiescent current which are properties that are dependent upon the physics of the amplifier circuit design.

When Eq. (6) is used to represent the power amplifier, the Taylor series expansion of Eq. (5) has the values of k as follows:

$$k_1 = G/V_{tr}$$
$$k_2 = G/(4V_{tr}^2)$$
$$k_3 = G/(6V_{tr}^3)$$
$$k_4 = G/(24V_{tr}^4)$$
$$k_5 = G/(120V_{tr}^5)$$

Eqs. (7)

In general the input signal, $V_i$, is formed as the sum of any number of carrier terms, $C_j$ where if N is the number of carrier terms, $V_i$ is given as follows:

$$V_i = \sum_{j=1}^{N} C_j \quad\quad \text{Eq. (8)}$$

Each of the carrier terms $C_j$ is represented by a modulated periodic function, for example, a cosine function, as follows:

$$C_j=a_j \cos[\omega_j(t)+m_j(t)] \quad\quad \text{Eq. (9)}$$

where:

$a_j$=carrier amplitude $\omega_j(t)$=carrier frequency $m_j(t)$=carrier modulation When the input signal, $V_i$, includes terms as represented by Eq. (9), the distorted output signal, $V_{od}$, of Eqs. (4), (5) and (6) includes many unwanted signal components. For example, for any two carriers $C_j$ and $C_{j+1}$ (including the carrier frequencies $\omega_j(t)$ and $\omega_{j+1}(t)$, the distorted output includes not only $\omega_j(t)$ and $\omega_{j+1}(t)$ but also components $u_j\omega_j(t)v_{j+1}\omega_{j+1}(t)$ for each of $u_j$ and $v_{j+1}$ equal to all positive integers. More generally, for N carriers, the distorted output includes products of the terms $u_1\omega_1(t), u_2\omega_2(t), \ldots, u_j\omega_j(t), u_{j+1}\omega_{j+1}, \ldots, u_N\omega_N$ for each of the values $u_1, u_2, \ldots, u_j, u_{j+1}, \ldots, u_N$ equal to all positive integers.

Clearly, the number of terms that are possible, even for a simple two carrier example, is computationally large. To form $V_{pd}$ with full precision would be extraordinarily complex and can be represented as follows:

$$V_{pd}=F[u_1\omega_1, u_2\omega_2, \ldots, u_j\omega, u_{j+1}\omega_{j+1}, \ldots, u_N\omega_N] \quad\quad \text{Eq. (10)}$$

Most of the terms in Eq. (10) need not be selected in formation of $V_{pd}$. The terms in Eq. (10) are partitioned into groups including the selected group of terms, $H_{s(j)}$, that are utilized in forming the predistortion value $V_{pd}$ and the non-selected group, $H_{n(j)}$, not utilized in forming the predistortion value $V_{pd}$ so that $V_{pd}$ as used for predistortion is given as follows:

$$V_{pd}=H_{s(j)} \quad\quad \text{Eq. (11)}$$

The selection of terms for $H_{s(j)}$ is based on recognition that some of the components in Eq. (10) are more significant than others. For example, the third harmonic components $2\omega_j(t)$ and $2\omega_{j+}(t)$ are particularly significant. The third harmonic components $2\omega_j(t)$ and $2\omega_{j+1}(t)$ which appear in the form $2\omega_j(t)-\omega_{j+1}(t)$ and $2\omega_{j+1}(t)-\omega_j(t)$ for j equal 1, 2, ..., N where N is equal to the number of carriers in the input signal so that $H_{s(j)}$ is given as follows:

$$H_{s(j)} = [2\omega_2(t) - \omega_1(t)] +$$ Eq. (12)

$$[2\omega_1(t) - \omega_2(t)] +$$

$$\vdots$$

$$[2\omega_{j+1}(t) - \omega_j(t)] +$$

$$[2\omega_j(t) - \omega_{j+1}(t)] +$$

$$\vdots$$

$$[2\omega_N(t) - \omega_{N-1}(t)] +$$

$$[2\omega_{N-1}(t) - \omega_N(t)]$$

While the third harmonic components of Eq. (12) are particularly significant, the present invention can be used to remove these or any other unwanted components that cause unwanted intermodulation distortion. The unwanted componets to be removed are selected as part of $H_{s(j)}$ in the formation of $V_{pd}$. The formation and selection of $V_{pd}$ is considered in connection with some examples.

For a two carrier example, N=2, Eq. (8) becomes:

$$V_i = \sum_{j=1}^{2} a_j \cos(\omega_j(t) + m_j(t))$$ Eq. (13)

Eq. (13) is expanded as follows:

$$V_i = a_1 \cos[\omega_1(t) + m(t)] + a_2 \cos[\omega_2(t) + m(t)]$$ Eq. (14)

Using the input signal, $V_i$, of Eq. (14) and using an expansion to the third and fifth harmonics, the Taylor series expansion for the output signal, $V_{od}$, in the Eq. (5) format is given as Eq. (15) as follows:

$$V_{od} = \frac{a_1^2 k_2}{2} + \frac{a_2^2 k_2}{2} + \frac{3a_1^4 k_4}{8} + \frac{3a_1^2 a_2^2 k_4}{2} + \frac{3a_2^4 k_4}{8} +$$

$$a_1 k_1 \cos[m_1(t) + \omega_1(t)] + \frac{3a_1^3 k_3 \cos[m_1(t) + \omega_1(t)]}{4} +$$

$$\frac{3a_1 a_2^2 k_3 \cos[m_1(t) + \omega_1(t)]}{2} + \frac{5a_1^5 k_5 \cos[m_1(t) + \omega_1(t)]}{8} +$$

$$\frac{15a_1^3 a_2^2 k_5 \cos[m_1(t) + \omega_1(t)]}{4} + \frac{15a_1 a_2^4 k_5 \cos[m_1(t) + \omega_1(t)]}{8} +$$

$$\frac{a_1^2 k_2 \cos[2m_1(t) + 2\omega_1(t)]}{2} + \frac{a_1^4 k_4 \cos[2m_1(t) + 2\omega_1(t)]}{2} +$$

$$\frac{3a_1^2 a_2^2 k_4 \cos[2m_1(t) + 2\omega_1(t)]}{2} + \frac{a_1^3 k_3 \cos[3m_1(t) + 3\omega_1(t)]}{4} +$$

$$\frac{5a_1^5 k_5 \cos[3m_1(t) + 3\omega_1(t)]}{16} + \frac{5a_1^3 a_2^2 k_5 \cos[3m_1(t) + 3\omega_1(t)]}{4} +$$

$$\frac{a_1^4 k_4 \cos[4m_1(t) + 4\omega_1(t)]}{8} + \frac{a_1^5 k_5 \cos[5m_1(t) + 5\omega_1(t)]}{16} +$$

$$\frac{5a_1 a_2^4 k_5 \cos[m_1(t) - 4m_2(t) + \omega_1(t) - 4\omega_2(t)]}{16} +$$

$$\frac{1a_1^3 k_4 \cos[m_1(t) - 3m_2(t) + \omega_1(t) - 3\omega_2(t)]}{2} +$$

$$\frac{5a_1^2 a_2^3 k_5 \cos[2m_1(t) - 3m_2(t) + 2\omega_1(t) - 3\omega_2(t)]}{8} +$$

$$\frac{3a_1 a_2^2 k_3 \cos[m_1(t) - 2m_2(t) + \omega_1(t) - 2\omega_2(t)]}{4} +$$

-continued $$\frac{15a_1^3 a_2^2 k_5 \cos[m_1(t) - 2m_2(t) + \omega_1(t) - 2\omega_2(t)]}{8} +$$

$$\frac{5a_1 a_2^4 k_5 \cos[m_1(t) - 2m_2(t) + \omega_1(t) - 2\omega_2(t)]}{4} +$$

$$\frac{3a_1^2 a_2^2 k_4 \cos[2m_1(t) - 2m_2(t) + 2\omega_1(t) - 2\omega_2(t)]}{4} +$$

$$\frac{5a_1^3 a_2^2 k_5 \cos[3m_1(t) - 2m_2(t) + 3\omega_1(t) - 2\omega_2(t)]}{8} +$$

$$a_1 a_2 k_2 \cos[m_1(t) - m_2(t) + \omega_1(t) - \omega_2(t)] +$$

$$\frac{3a_1^3 a_2 k_4 \cos[m_1(t) - m_2(t) + \omega_1(t) - \omega_2(t)]}{2} +$$

$$\frac{3a_1 a_2^3 k_4 \cos[m_1(t) - m_2(t) + \omega_1(t) - \omega_2(t)]}{2} +$$

$$\frac{3a_1^2 a_2 k_3 \cos[2m_1(t) - m_2(t) + 2\omega_1(t) - \omega_2(t)]}{4} +$$

$$\frac{5a_1^4 a_2 k_5 \cos[2m_1(t) - m_2(t) + 2\omega_1(t) - \omega_2(t)]}{4} +$$

$$\frac{15a_1^2 a_2^3 k_5 \cos[2m_1(t) - m_2(t) + 2\omega_1(t) - \omega_2(t)]}{8} +$$

$$\frac{a_1^3 a_2 k_4 \cos[3m_1(t) - m_2(t) + 3\omega_1(t) - \omega_2(t)]}{2} +$$

$$\frac{5a_1^4 a_2 k_5 \cos[4m_1(t) - m_2(t) + 4\omega_1(t) - \omega_2(t)]}{16} +$$

$$a_2 k_1 \cos[m_2(t) + \omega_2(t)] + \frac{3a_1^2 a_2 k_3 \cos[m_2(t) + \omega_2(t)]}{2} +$$

$$\frac{3a_2^3 k_3 \cos[m_2(t) + \omega_2(t)]}{4} + \frac{15a_1^4 a_2 k_5 \cos[m_2(t) + \omega_2(t)]}{8} +$$

$$\frac{15a_1^2 a_2^3 k_5 \cos[m_2(t) + \omega_2(t)]}{4} + \frac{5a_2^5 k_5 \cos[m_2(t) + \omega_2(t)]}{8} +$$

$$a_1 a_2 k_2 \cos[m_1(t) + m_2(t) + \omega_1(t) + \omega_2(t)] +$$

$$\frac{3a_1^3 a_2 k_4 \cos[m_1(t) + m_2(t) + \omega_1(t) + \omega_2(t)]}{2} +$$

$$\frac{3a_1 a_2^3 k_4 \cos[m_1(t) + m_2(t) + \omega_1(t) + \omega_2(t)]}{2} +$$

$$\frac{3a_1^2 a_2 k_3 \cos[2m_1(t) + m_2(t) + 2\omega_1(t) + \omega_2(t)]}{4} +$$

$$\frac{5a_1^4 a_2 k_5 \cos[2m_1(t) + m_2(t) + 3\omega_1(t) + \omega_2(t)]}{4} +$$

$$\frac{15a_1^2 a_2^3 k_5 \cos[2m_1(t) + m_2(t) + 2\omega_1(t) + \omega_2(t)]}{8} +$$

$$\frac{a_1^3 a_2 k_4 \cos[3m_1(t) + m_2(t) + 3\omega_1(t) + \omega_2(t)]}{2} +$$

$$\frac{5a_1^4 a_2 k_5 \cos[4m_1(t) + m_2(t) + 4\omega_1(t) + \omega_2(t)]}{16} +$$

$$\frac{a_2^2 k_2 \cos[2m_2(t) + 2\omega_2(t)]}{2} +$$

$$\frac{3a_1^2 a_2^2 k_4 \cos[2m_2(t) + 2\omega_2(t)]}{2} + \frac{a_2^4 k_4 \cos[2m_2(t) + 2\omega_2(t)]}{2} +$$

$$\frac{3a_1 a_2^2 k_3 \cos[m_1(t) + 2m_2(t) + \omega_1(t) + 2\omega_2(t)]}{4} +$$

$$\frac{15a_1^3 a_2^2 k_5 \cos[m_1(t) + 2m_2(t) + \omega_1(t) + 2\omega_2(t)]}{8} +$$

-continued $$\frac{5a_1 a_2^4 k_5 \text{Cos}[m_1(t) + 2m_2(t) + \omega_1(t) + 2\omega_2(t)]}{4} +$$

$$\frac{3a_1^2 a_2^2 k_4 \text{Cos}[2m_1(t) + 2m_2(t) + 2\omega_1(t) + 2\omega_2(t)]}{4} +$$

$$\frac{5a_1^3 a_2^2 k_5 \text{Cos}[3m_1(t) + 2m_2(t) + 3\omega_1(t) + 2\omega_2(t)]}{8} +$$

$$\frac{a_2^3 k_3 \text{Cos}[3m_2(t) + 3\omega_2(t)]}{4} + \frac{5a_1^2 a_2^3 k_5 \text{Cos}[3m_2(t) + 3\omega_2(t)]}{4} +$$

$$\frac{5a_2^5 k_5 \text{Cos}[3m_2(t) + 3\omega_2(t)]}{16} +$$

$$\frac{a_1 a_2^3 k_4 \text{Cos}[m_1(t) + 3m_2(t) + \omega_1(t) + 3\omega_2(t)]}{2} +$$

$$\frac{5a_1^2 a_2^3 k_5 \text{Cos}[2m_1(t) + 3m_2(t) + 2\omega_1(t) + 3\omega_2(t)]}{8} +$$

$$\frac{a_2^4 k_4 \text{Cos}[4m_2(t) + 4\omega_2(t)]}{8} +$$

$$\frac{5a_1 a_2^4 k_5 \text{Cos}[m_1(t) + 4m_2(t) + \omega_1(t) + 4\omega_2(t)]}{16} +$$

$$\frac{a_2^5 k_5 \text{Cos}[5m_2(t) + 5\omega_2(t)]}{16}$$

The distorted output, $V_{od}$, of Eq. (15) includes the unwanted third harmonic component terms of the following form $[m_1(t)-2m_2(t)+\omega_1(t)-2\omega_2(t)]$ and $[2m_1(t)-m_2(t)+2\omega_1(t)-\omega_2(t)]$. More particularly, Eq. (15) includes the terms:

$$\frac{3a_1 a_2^2 k_3 \text{Cos}[m_1(t) - 2m_2(t) + \omega_1(t) - 2\omega_2(t)]}{4} +$$

$$\frac{15a_1^3 a_2^2 k_5 \text{Cos}[m_1(t) - 2m_2(t) + \omega_1(t) - 2\omega_2(t)]}{8} +$$

$$\frac{5a_1 a_2^4 k_5 \text{Cos}[m_1(t) - 2m_2(t) + \omega_1(t) - 2\omega_2(t)]}{4}$$

Exp. (16)

$$\frac{3a_1^2 a_2 k_3 \text{Cos}[2m_1(t) - m_2(t) + 2\omega_1(t) - \omega_2(t)]}{4} +$$

$$\frac{5a_1^4 a_2 k_5 \text{Cos}[2m_1(t) - m_2(t) + 2\omega_1(t) - \omega_2(t)]}{4} +$$

$$\frac{15a_1^2 a_2^3 k_5 \text{Cos}[2m_1(t) - m_2(t) + 2\omega_1(t) - \omega_2(t)]}{8}$$

Exp. (17)

The terms of Exp. (16) and Exp. (17) are the selected terms of Eq. (12) used to form the predistortion signal, $V_{pd}$, for the third harmonic. In order to be used, however, the Exp. (16) and Exp. (17) terms are scaled. Referring to Eq. (3), the magnitude of the scaling factor required is determined by the transfer function of the power amplifier.

The power amplifier operates on both the input signal $V_i$ and the predistortion signal, $V_{pd}$ and Eq. (3) is rewritten as follows:

$$V_O = (V_i)(T_{pa}) + (V_{pd})(T_{pa})$$   Eq. (18)

The terms of Exp. (16) and Exp. (17) are derived from the output $(V_{pd})$ $(T_{pa})$ and hence must be scaled by $1/(T_{pa})$ in order to form $V_{pd}$. Eq. (6) can be rewritten as follows:

$$\frac{V_{od}}{G} + 1 = e^{(V_i/V_{tr})}$$   Eq. (19)

$$V_i = V_{tr}\left[\log\left(\frac{V_{od}}{G} + 1\right)\right]$$   Eq. (20)

Using Eq. (20) to calculate the scaling factors for the third harmonic terms of Exp. (16) and Eq. (17), assuming $V_{pd}$ is the only input to the non-linear element 12, produces the following:

$$V_{pd} = V_{tr}\left[\log\left(\frac{V_{od(13)}}{G} + 1\right)\right] + V_{tr}\left[\log\left(\frac{V_{od(23)}}{G} + 1\right)\right]$$   Eq. (21)

where $V_{od13}$ is given by the sum of the multipliers for the Cos functions of Exp. (16) as follows:

$$V_{od13} = \frac{3a_1 a_2^2 k_3}{4} + \frac{15a_1^3 a_2^2 k_5}{8} + \frac{5a_1 a_2^4 k_5}{4}$$   Eq. (22)

where $V_{od23}$ is given by the sum of the multipliers for the Cos functions of Exp. (17) as follows:

$$V_{od23} = \frac{3a_1^2 a_2 k_3}{4} + \frac{5a_1^4 a_2 k_5}{4} + \frac{15a_1^2 a_2^3 k_5}{8}$$   Eq. (23)

The scaling factor, $S_f$, using Eq. (22) and Eq. (23) in Eq. (21) is given as follows:

$$S_f = \left(\frac{2(a_1 + a_2 + V_{pd})}{G\left(e^{\frac{(a_1+a_2)}{V_{tr}}} - e^{\frac{-(a_1+a_2)}{V_{tr}}}\right)}\right)$$   Eq. (24)

The predistortion signal, $V_{pd}$, determined for the third harmonic terms is given as follows:

$$V_{pd} = V_{pd13} + V_{pd23}$$   Eq. (25)

where $V_{pd\_}$ and $V_{pd23}$ are the scaled component signals derived from the third harmonic terms of Exp. (16) and Exp. (17), respectively, given as follows:

$$V_{pd13} = (S_f)(V_{od13})\text{Cos}[2\omega_1(t) + 2m_1(t) - m_2(t) + \Psi_1]$$   Eq. (26)

$$V_{pd23} = (S_f)(V_{od23})\text{Cos}[2\omega_2(t) + 2m_2(t) - m_1(t) + \Psi_2]$$   Eq. (27)

While the above description explained the derivation of the third harmonic terms and the resulting predistortion signal, $V_{pd}$, any unwanted signal components can be eliminated in the same manner.

Figure 6:
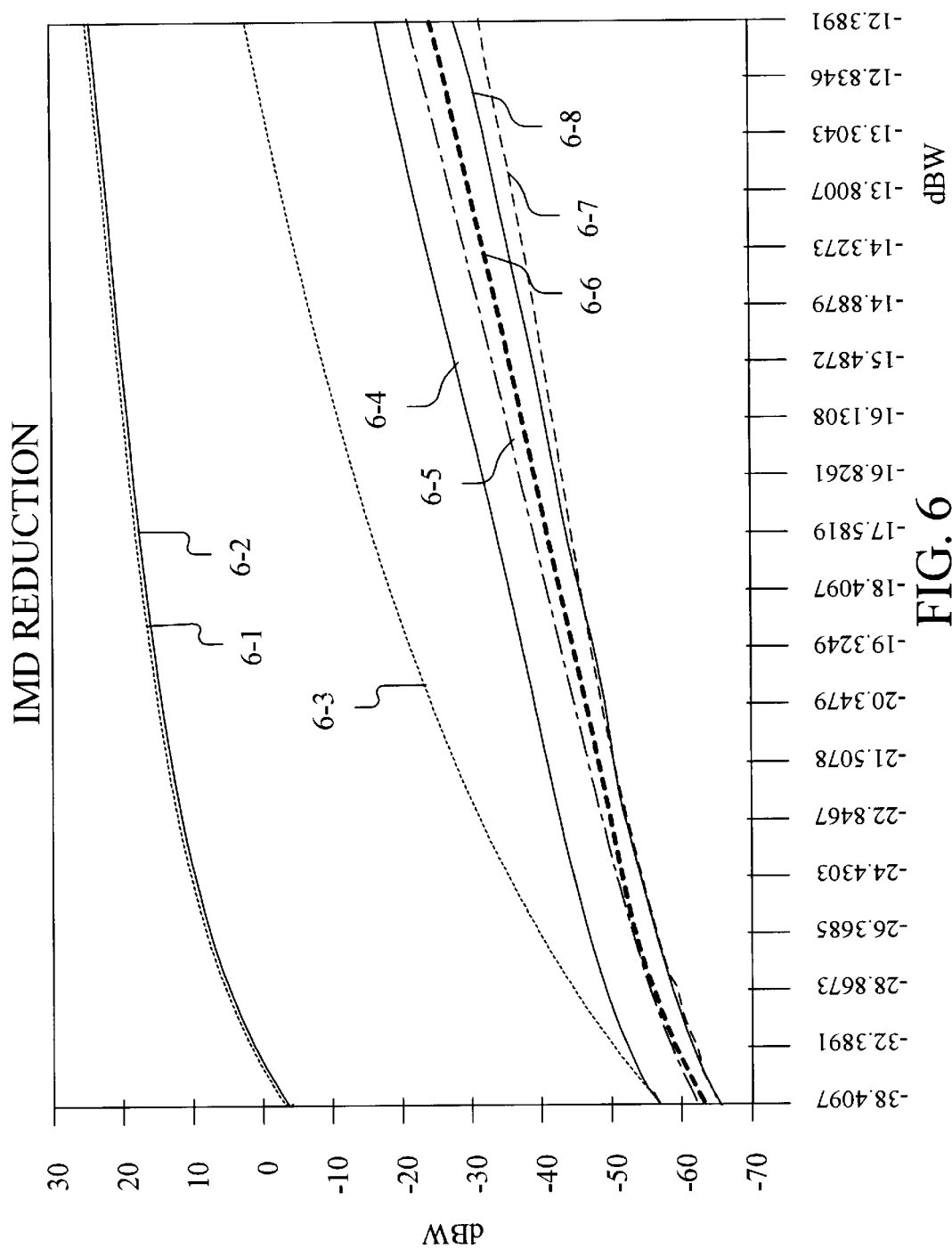
FIG. 6 depicts a graph representing the power levels of output waveforms of the FIG. 1 circuitry both without predistortion processing and with predistortion processing.

By way of further explanation, the following PROGRAM LISTING determines the components for the fundamental ($1^{st}$) and for the $3^{rd}$ and $5^{th}$ harmonics, produces the predistortion components for the $3^{rd}$ and $5^{th}$ harmonics, and produces the outputs for the $3^{rd}$, $5^{th}$, and $7^{th}$ harmonics as shown in the graph of FIG. 6.

PROGRAM LISTING
COPYRIGHT © CELLULAR TELCOM LTD. 1996

```
1    % This program specifies the operation of a non-linear amplifier and compares the
2    % intermodulation performance of two FM modulated carriers under three conditions:
3    % No predistortion (v*1*)
4    % Predistortion to reduce the 3rd order term (v*2*)
5    % Predistortion to reduce the 3rd and 5th order terms (v*3*)
6    %
7    %Sampling Parameters
8    %
9    frequency = 64e6;
10   numsamps = 2^16;
11   x = 1/frequency : 1/frequency : ((1/frequency)*(numsamps));
12   %
13   % Transistor model
14   %
15   V_tr = 10%;  % this is the threshold Voltage only important relative to Vin and G
16   G = 100;    % this is Voutmax = R(load)*I(quiescent)*((exp(Vs/V_tr)-1) G = R1*Iq
17               % NOT GAIN this is circuit dependent
18   PhaseShift = -1; % cancelling terms 180 degrees out of phase
19   k1 = G/V_tr;  % Constants for Taylor Expansion of the function
20   k2 = G/(4*V_tr^2); % Vout = G*(exp(VS/V_tr) -1)
21   k3 = G/(6*V_tr^3);
22   k5 = G/(120*V_tr^5);
23   %
24   %Plotting Parameters
25   %
26   plot_strt = 6000;
27   plot_stop = 14000;
28   %
29   % frequency parameters
30   %
31   frequency_deviation = 30e3;     % 30 KHz
32   k = (frequency_deviation/frequency)*2*pi;
33   f1_Hz = 10e6;
34   f2_Hz = 10.4e6;
35   t11_Hz = 800;
36   t12_Hz = 900;
37   t21_Hz = 1000;
38   t22_Hz = 1100;
39   w1 = f1_Hz*2*pi;
40   w2 = f2_Hz*2*pi;
41   t11 = t11_Hz*2*pi;
42   t12 = t12_Hz*2*pi;
43   t21 = t21_Hz*2*pi;
44   t22 = t22_Hz*2*pi;
45   %
46   % Loop Settings
47   %
48   loop_stop = V_tr;
49   loop_step = .5;
50   loop_cnt = 1;
51   % Calcutate where to look for power
52   f1_center = ceil(f1_Hz*(numsamps/frequency));
53   f1_3_center = ceil((2*f1_Hz-f2_Hz)*(numsamps/frequency));
54   f1_5_center = ceil((3*f1_Hz-2*f2_Hz)*(numsamps/frequency));
55   f1_7_center = ceil((4*f1_Hz-3*f2_Hz)*(numsamps/frequency));
56   bw = frequency_deviation*(numsamps/frequency);     % Sample wide
57   %
58   % Initialize result vectors
59   %
60   sig_in = zeros(1,loop_stop/loop_step);
61   sig_in2 = zeros(1,loop_stop/loop_step);
62   sig_in3 = zeros(1,loop_stop/loop_step);
63   imd3_1 = zeros(1,loop_stop/loop_step);
64   imd3_2 = zeros(1,loop_stop/loop_step);
65   imd3_3 = zeros(1,loop_stop/loop_step);
66   sig_o1 = zeros(1,loop_stop/loop_step);
67   sig_o2 = zeros(1,loop_stop/loop_step);
68   sig_o3 = zeros(1,loop_stop/loop_step);
69   imd5_1 = zeros(1,loop_stop/loop_step);
70   imd5_2 = zeros(1,loop_stop/loop_step);
71   imd5_3 = zeros(1,loop_stop/loop_step);
72   imd7_1 = zeros(1,loop_stop/loop_step);
73   imd7_2 = zeros(1,loop_stop/loop_step);
74   imd7_3 = zeros(1,loop_stop/loop_step);
75   %
76   % Modulate
```

-continued

PROGRAM LISTING
COPYRIGHT © CELLULAR TELCOM LTD. 1996

```
77   %
78   info1 = .5 .* (cos(t11*x) + cos(t12*x));      %Information Signal
79   info2 = .5 .* (cos(t21*x) + cos(t22*x));
80   m1 = k*cumsum(info1);        % Modulating functions
81   m2 = k*cumsum(info2);
82   %%%%%%%%%%%%%%%%%%%%%%%%%%%%%%%%%%%%%%%%%%%
83   %%%%%%%%%%%%%%%%%%%%%%%%%%%%%%%%%%%%%%%%%%
84   % Main Loop
85   %%%%%%%%%%%%%%%%%%%%%%%%%%%%%%%%%%%%%%%%%%%
86   %%%%%%%%%%%%%%%%%%%%%%%%%%%%%%%%%%%%%%%%%%
87   for iii=loop_step : loop_step :loop_stop
88   %
89   % FM Modulated Carriers and Modulating functions
90   %
91   a1 = iii;       %Peak input amplitude
92   a2 = iii;
93   c1 = a1*cos(w1*x + m1);     % Modulated Carriers
94   c2 = a2*cos(W2*x + m2);
95   %
96   % Input Signal Creation
97   %
98   Vs = c1 + c2;
99   Vs_aft = abs(fft(Vs))/numsamps;
100  Vs_fft = 20*log10(Vs_aft);
101  % Measure
102  sig_in(loop_cnt) = max(Vs_fft(f1_center-bw:f1_center+bw-1));
103  %
104  % Amplifier without Predistortion - Generate FFT of output
105  %
106  vout1 = G*((exp(Vs/V_tr)-1));
107  vout1_aft = abs(fft(vout1))/numsamps;
108  vout1_fft = 20*log10(vout1_aft);
109  % Measure terms
110  imd3_1(loop_cnt) = max(vout1_fft(f1_3_center-bw:f1_3_center+bw-1));
111  imd5_1(loop_cnt) = max(vout1_fft(f1_5_center-bw:f1_5_center+bw-1));
112  imd7_1(loop_cnt) = max(vout1_fft(f1_7_center-bw:f1_7_center+bw-1));
113  sig_o1(loop_cnt) = max(vout1_fft(f1_center-bw:f1_center+bw-1));
114  %
115  % Amplifier WITH PREDISTORTION
116  % - predistortion scaling based on measuring gain of vout including
117  % estimated cancelling terms to Vin, they reduce the gain
118  % Compute Cancelation terms (third order only)
119  %First collect the terms for the desired signal to be cancelled
120  %These include terms from fifth order expansion
121  Vout13 = (3/4)*a1^2*a2*k3 +...
122         (5*a1^4*a2*k5)/4 +...
123         (15*a1^2*a2^3*k5)/8;
124  ;       % These are the peak voltages
125  Vout23 = (3/4)*a1*a2^2*k3 +...
126         (15*a1^3*a2^2*k5)/8 +...
127         (5*a1*a2^4*k5)/4;
128  % First calculate the magnitude of the predistortion signals
129  % by collecting terms of the desired frequency from the series expansion
130  % and Vs = V_tr*log((Vout/G) +1)
131  Vpd_in = V_tr*log(1+(Vout13/G)) + V_tr*log(1+(Vout23/G));
132  %This is used to calculate a prescale term based on the gain of the amplifier
133  PreScale = ((2*(a1+a2+Vpd_in))/(G* (exp((a1+a2)/V_tr) - exp(-1*(a1+a2)/V_tr))))
134  %Now the actual
135  Vpd13 = PhaseShift*Prescale * Vout13 * cos((2*w1*x) + (2*m1) - (w2*x) - m2);
136  Vpd23 = PhaseShift*Prescale * Vout23 * cos((2*w2*x) + (2*m2) - (w1*x) - m1);
137  % Generate output with predistorted input
138  Vs = c1 + c2 + Vpd13 + Vpd23;
139  Vs_aft = abs(fft(Vs))/numsamps;
140  Vs_fft = 20*log10(Vs_aft);
141  % Measure
142  sig_in2(loop0_cnt) = max(Vs_fft(f1_center-bw:f1_center+bw-1));
143  vout2 = G*((exp(Vs/V_tr)-1));
144  vout2_aft = abs(fft(vout2))/numsamps;
145  vout2_fft = 20*log10(vout2_aft);
146  % Measure
147  imd3_2(loop_cnt) = max(vout2_fft(f1_3_center-bw:f1_3_center+bw-1));
148  imd5_2(loop_cnt) = max(vout2_fft(f1_5_center-bw:f1_5_center+bw-1));
149  imd7_2(loop_cnt) = max(vout2_fft(f1_7_center-bw:f1_7_center+bw-1));
150  sig_o2(loop_cnt) = max(vout2_fft(f1_center-bw:f1_center+bw-1));
151  % Amplifier with predistortion 3RD AND 5TH
152  % - predistortion scaling based on measuring gain of vout including
```

-continued

PROGRAM LISTING
COPYRIGHT © CELLULAR TELCOM LTD. 1996

```
153  % estimated canceling terms to Vin, they reduce the gain
154  %Compute Cancelation terms (third order only)
155  % First estimate the magnitude of the predistortion inputs Vs1 and Vs2
156  Vpd_in = V_tr*log(1+(Vout13/G)) + V_tr*log(1+(Vout23/G));
157  Prescale = ((2*(a1+a2+Vpd_in))/(G* (exp((a1+a2)/V_tr) – exp(–1*(a1+a2)/V_tr))));
158  a13 = PhaseShift*PreScale*Vout13
159  a23 = PhaseShift*PreScale*Vout23
160  Vpd13 = PhaseShift*PreScale * Vout13 * cos((2*w1*x) + (2*m1) – (w2*x) – m2);
161  Vpd23 = PhaseShift*Prescale * Vout23 * cos((2*w2*x) + (2*m2) – (w1*x) – m1);
162  % Now estimate the magnitude of the 5th order term
163  Vout15 = (3*a1*a13^2*k3)/4+...
164  (3*a1*a13*a2*k3)/2+...
165  (3*a1^2*a23*k3)/4+...
166  (3*a13*a2*a23*k3)/2+
167  (15*a1^3*a13^2*k5)/8+...
168  (5*a1*a13^4*k5)/4+
169  (15*a1^3*a1^3*a2*k5)/4+...
170  (15*a1*a13^3*a2*k5)/4+...
171  (5*a1^3*a2^2*k5)/8+...
172  (15*a1*a13^2*a2^2*k5)/4+...
173  (15*a1*a13*a2^3*k5)/4+...
174  (5*a1^4*a23*k5)/4+...
175  (15*a1^2*a13^2*a23*k5)/4+...
176  (15*a1^2*a13*a2*a23*k5)/2+...
177  (15*a13^3*a2*a23*k5)/4+...
178  (15*a1^2*a2^2*a23*k5)/4+...
179  (15*a13^2*a2^2*a23*k5)/8+...
180  (15*a13*a2^3*a23*k5)/4+...
181  (15*a1*a13^2*a23^2*k5)/4+...
182  (15*a1*a13*a2*a23^2*k5)/2+...
183  (15*a1*a2^2*a23^2*k5)/8+...
184  (15*a1^2*a23^3*k5)/8+...
185  (15*a13*a2*a23^3*k5)/4;
186  Vout25 = (3*a13*a2^2*k3)/4+...
187  (3*a1*a13*a23*k3)/2+...
188  (3*a1*a2*a23*k3)/2+...
189  (3*a2*a23^2*k5)/4+...
190  (15*a1^2*a13^2*a2*k5)/8+...
191  (15*a1^2*a13*a2^2*k5)/4+...
192  (15*a13^3*a2^2*k5)/8+...
193  (5*a1^2*aa2^3*k5)/8+...
194  (5*a13*a2^4*k5)/4+...
195  (15*a1^3*a13*a23*k5)/4+...
196  (15*a1*a13^3*a23*k5)/4+...
197  (15*a1^3*a2*a23*k5)14+...
198  (15*a1*a13^2*a2*a23*k5)/2+...
199  (15*a1*a13*a2^2*a23*k5)/2+...
200  (15*a1*a2^3*a23*k5)/4+...
201  (15*a1^2*a13*a23^2*k5)/8+...
202  (15*a1^2*a2*a23^2*k5)/4+...
203  (15*a13^2*a2*a23^2*k5)/4+...
204  (15*a13*a2^2*a23^2*k5)/4+...
205  (15*a2^3*a23^2*k5)/8+...
206  (15*a1*a13*a23^3*k5)/4+...
207  (15*a1*a2*a23^3*k5)/4+...
208  (5*a2*a23^4*k5)/4;
209  % Now recalculate Vpd_in using Vout15 and Vout25
210  Vpd_in = V_tr*log(1+(Vout13/G)) + V_tr*log(1+(Vout23/G)) +...
211     V_tr*log(1+(abs(Vout15)/G)) + V_tr*log(1+(abs(Vout25)/G));
212  Prescale = (2*(a1+a2+Vpd_in)) / (G* (exp((a1+a2)/V_tr) – exp(–1*(a1+a2)/V_tr)));
213  %Prescale = ((a1+a2 +Vpd_in)) / (G* (exp((a1+a2)/V_tr) – exp(–1*(a1+a2)/V_tr)));
214  Vpd15 = PhaseShift*Prescale*Vout15*cos((3*w1*x) + (3*m1) – (2*w2*x) – (2*m2));
215  Vpd25 = PhaseShift*PreScale*Vout25*cos((3*w2*x) + (3*m2) – (2*w1*x) – (2*m1));
216  % Vpd – voltage with predistortion 3 and 5
217  Vs = c1 + c2 + Vpd13 + Vpd23 + Vpd15 + Vpd25;
218  Vs_aft = abs(fft(Vs))/numsamps;
219  Vs_fft = 20*log10(Vs_aft);
220  % Measure
221  sig_in3(loop_cnt) = max(Vs_fft(f1_center–bw:f1_center+bw–1));
222  vout3 = G*((exp(Vs/V_tr)–1));
223  vout3_aft = abs(fft(vout3))/numsamps;
224  vout3_fft = 20*log10(vout3_aft);
225  % Measure
226  imd3_3(loop_cnt) = max(vout3_fft(f1_3_center–bw:f1_3_center+bw–1));
227  imd5_3(loop_cnt) = max(vout3_fft(f1_5_center–bw:f1_5_center+bw–1));
228  imd7_3(loop_cnt) = max(vout3_fft(f1_7_center–bw :f1_7_center+bw–1));
```

-continued

PROGRAM LISTING
COPYRIGHT © CELLULAR TELCOM LTD. 1996

```
229    sig_o3(loop_cnt) = max(vout3_fft(f1_center-bw:f1_center+bw-1));
230    loop_cnt = loop_cnt + 1;
231    end
232    plot(sig_in, 'w')
233    hold on
234    %plot(sig_in2, 'g')
235    %plot(sig_in3, 'b')
236    plot(sig_o1, 'r');
237    plot(sig_o2, 'g');
238    plot(sig_o3, 'b');
239    plot(imd3_1, 'r');
240    plot(imd3_2, 'g');
241    plot(imd3_3, 'b');
242    plot(imd5_1, 'r');
243    plot(imd5_2, 'g');
244    plot(imd5_3, 'b');
245    plot(imd7_1, 'r');
246    plot(imd7_2, 'g');
247    plot(imd7_3, 'b');
248    hold off
249    ci1 = sig_o1 - imd3_1;
250    ci2 = sig_o2 - imd3_2;
251    %plot(ci1, 'g')
252    %hold on
253    %plot(ci2, 'r');
254    %hold off
```

Amplifier Performance Graph—FIG. 6

The effect of the insertion of the $V_{pd}$ predistortion terms into a non-linear amplifier is shown by the traces in FIG. 6.

In FIG. 6, the output power is graphed as a function of the input power using units of $dB_W$ where $dB_W$=101 og {power (watts)/1(watt)}. For cellular communications systems, the input power range is typically 10 to 20 milliwatts and the output power range is typically from 3 to 100 watts.

In FIG. 6, the $V_{out}$ trace 6-1 represents the output without any predistortion and the $V_{outpD}$ TRACE 6-2 represents the output with predistortion. The $V_{out}$ and the $V_{outpD}$ traces are in substance the same.

In FIG. 6, the IMD3 trace 6-3 represents the contribution of the intermodulation third harmonic terms to $V_{out}$ in the absence of any predistortion. It is apparent that a substantial portion of the power of $V_{out}$ is represented by third harmonic intermodulation products of IMD3.

In FIG. 6, the $IMD3_{PD}$ trace 6-4 represents the third harmonic component of $V_{outpD}$ when third harmonic predistortion, in accordance with the present invention, has been inserted into $V_{id}$. As can be seen from a comparison of IMD3 and $IMD3_{PD}$, the third harmonic component of $V_{outpD}$ is substantially reduced ($IMD3_{PD}$ is much less than IMD3) so that the efficiency of the amplifier for a given level of distortion is substantially increased.

In FIG. 6, the IMD5 trace 6-5 represents the contribution of the fifth harmonic intermodulation products to $V_{out}$ in the absence of any predistortion. The $IMD5_{PD}$ 6-6 trace indicates the contribution of the fifth harmonic products when the third harmonic and fifth harmonic predistortion components are inserted in accordance with the present invention. Note that even with the third and fifth predistortion, the third harmonic component $IMD3_{PD}$ is still the most significant unwanted signal component.

In FIG. 6, the IMD7 trace 6-7 represents the contribution of the seventh harmonic intermodulation products to $V_{out}$ in the absence of any predistortion. Also in FIG. 6, the $IMD7_{PD*}$ trace 6-8 indicates the effect of the seventh harmonic intermodulation distortion products when the third and fifth harmonic products are inserted into the predistortion input $V_{id}$. No seventh harmonic predistortion terms are inserted in the predistortion input $V_{id}$. The seventh harmonic intermodulation terms as represented by $IMD7_{PD*}$ are increased in $V_{outpD}$ in the absence of the insertion of any seventh harmonic predistortion due to the shift of some energy in the third and fifth harmonics into the seventh harmonic. However, the seventh harmonic distortion $IMD3_{PD*}$ in $V_{outpD}$ still is less than the third harmonic distortion $IMD3_{PD}$ and hence the seventh harmonic distortion has not interfered with the important improvements gained by reducing the third harmonic components.

In summary, the traces of FIG. 6 demonstrate that the selection of particular predistortion harmonic terms advantageously reduces unwanted intermodulation products in the output of non-linear elements without creating more adverse consequences in other unwanted intermodulation products. While seventh harmonic terms were not used as predistortion terms in the FIG. 6 example, seventh harmonic terms can be included thereby further reducing the effects of the seventh harmonic terms. While the effect of selecting additional harmonic terms has the effect of transferring some of the power in the selected predistortion terms to other non-selected predistortion terms, such a transfer is not concentrated in any particular one of the unselected harmonic terms but is generally distributed across many intermodulation terms so that the net effect of this transfer of energy does not detract from the beneficial and significant gains for the selected harmonic components.

While the invention has been particularly shown and described with reference to preferred embodiments thereof it will be understood by those skilled in the art that various changes in form and details may be made therein without departing from the spirit and scope of the invention.

What is claimed is:

1. In a communications system including,
    a modulator for modulating a plurality of information signals to provide a broadband input signal, $V_i$, having a plurality of frequency terms, a broadband processor for combining said input signal $V_i$ and a predistortion signal $V_{pd}$ to form a predistorted input signal $V_{id}$, a non-linear element having a non-linear transfer function for processing the predistortion signal, $V_{id}$, to provide an output signal, $V_o$, where the output signal includes terms of the Taylor series form $[k_1(V_i)^1, k_2(V_i)^2, k_3(V_i)^3, \ldots]$, a predistortion processor comprising, term generator means for generating selected predistortion terms of the Taylor series form $[k_1(V_i)^1, k_2(V_i)^2, k_3(V_i)^3, \ldots]$, phase shifter means for providing phase shifts to the selected predistortion terms to provide phase shifted terms that will reduce corresponding ones of the said terms in the output signal, $V_o$, periodic signal generator means for generating periodic signals from said phase shifted terms, scaling means for scaling the periodic signals in proportion to the transfer function of the non-linear element to form said predistortion signal $V_{pd}$.

2. The predistortion processor of claim 1 wherein said periodic signal generator means is a cosine generator.

3. The predistortion processor of claim 1 wherein said term generator means generates third harmonic terms.

4. In the communication system of claim 1 wherein said modulator receives said input information signals as one or more information signals $V_1(t), V_2(t), \ldots, V_j(t), \ldots, V_J(t)$ where J is an integer, receives one or more carriers $\omega_1(t), \omega_2(t), \ldots, \omega_j(t), \ldots, \omega_J(t)$ and receives one or more scalers scalers $a_1, a_2, \ldots, a_j, \ldots, a_J$ and wherein said modulator includes, base modulator means for baseband modulation of said information signals to provide one or more baseband signals $m_1(t), m_2(t), \ldots, m_j(t), \ldots, m_J(t)$, band modulation means for modulation of the carriers by the baseband signals to form said input signals $V_i$ including one or more of the signals $V_{i(1)}, \ldots, V_{i(j)}, \ldots, V_{(i)(J)}$, and wherein said predistortion signal includes $V_{pd(1)}, \ldots, V_{pd(s)}, \ldots, V_{pd(S)}$, where S is an integer.

5. The predistortion processor of claim 4 wherein said carriers $\omega_1(t), \omega_2(t), \ldots, \omega_j(t), \ldots, \omega_J(t)$ are GSM carriers for a cellular communications system.

6. The predistortion processor of claim 1 wherein said term generator means generates said selected predistortion terms as third harmonic terms, $H_{s(j)}$, using J carriers $\omega_1(t) \omega_2(t), \ldots, \omega_j(t), \ldots, \omega_J(t)$, where J is some integer, as follows:

$$H_{s(j)} = [2\omega_2(t) - \omega_1(t)] +$$
$$[2\omega_1(t) - \omega_2(t)] +$$
$$\vdots$$
$$[2\omega_{j+1}(t) - \omega_j(t)] +$$
$$[2\omega_j(t) - \omega_{j+1}(t)] +$$
$$\vdots$$

-continued
$$[2\omega_N(t) - \omega_{N-1}(t)] +$$
$$[2\omega_{N-1}(t) - \omega_N(t)] +$$

7. The predistortion processor of claim 6 wherein J is equal to 2 and said term generator means generates said third harmonic terms of the following forms:

$$\frac{3a_1 a_2^2 k_3 \cos[m_1(t) - 2m_2(t) + \omega_1(t) - 2\omega_2(t)]}{4} +$$
$$\frac{15a_1^3 a_2^2 k_5 \cos[m_1(t) - 2m_2(t) + \omega_1(t) - 2\omega_2(t)]}{8} +$$
$$\frac{5a_1 a_2^4 k_5 \cos[m_1(t) - 2m_2(t) + \omega_1(t) - 2\omega_2(t)]}{4}$$
$$\frac{3a_1^2 a_2 k_3 \cos[2m_1(t) - m_2(t) + 2\omega_1(t) - \omega_2(t)]}{4} +$$
$$\frac{5a_1^4 a_2 k_5 \cos[2m_1(t) - m_2(t) + 2\omega_1(t) - \omega_2(t)]}{4} +$$
$$\frac{15a_1^2 a_2^3 k_5 \cos[2m_1(t) - m_2(t) + 2\omega_1(t) + 2\omega_1(t) - \omega_2(t)]}{8}.$$

8. The predistortion processor of claim 1 wherein said term generator means generates third and fifth harmonic terms.

9. The signal processor of claim 1 wherein said broadband processor includes a frequency division multiplexer and a digital-to-analog converter.

10. The signal processor of claim 1 wherein said non-linear element is an RF amplifier.

11. A signal processor method for processing an information signal to form a processed output signal comprising:

modulating the information signal to form base modulated signals, modulating the base modulated signals to form an input signal $V_i$, providing a predistortion signal, $V_{pd}$, using the steps of,
    generating selected distortion terms of the Taylor series form $[k_1(V_i)^1, k_2(V_i)^2, k_3(V_i)^3, \ldots]$ where $k_1, k_2, k_3, \ldots$ are amplitudes of the terms $(V_i)^1, (V_i)^2, (V_i)^3, \ldots$, respectively, phase shifting said selected distortion terms to provide phase shifted terms, generating periodic signals from the phase shifted terms, scaling the periodic signals in proportion to a non-linear transfer function to form said predistortion signal, $V_{pd}$, combining said input signal, $V_i$, and said predistortion signal, $V_{pd}$, by broadband processing to form a predistorted signal, $V_{id}$, with said selected predistortion terms of the Taylor series form $[k_1(V_i)^1, k_2(V_i)^2, k_3(V_i)^3, \ldots]$ reduced in amplitude, processing said predistorted signal $V_{id}$ in a non-linear element having said non-linear transfer function to form said processed output signal.

* * * * *